(12) United States Patent
Arcoleo et al.

(10) Patent No.: US 6,640,266 B2
(45) Date of Patent: Oct. 28, 2003

(54) METHOD AND DEVICE FOR PERFORMING WRITE OPERATIONS TO SYNCHRONOUS BURST MEMORY

(75) Inventors: Mathew R. Arcoleo, Campbell, CA (US); Rajesh Manapat, San Jose, CA (US); Scott Harmel, Gilroy, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 165 days.

(21) Appl. No.: 09/815,599

(22) Filed: Mar. 23, 2001

(65) Prior Publication Data

US 2001/0052045 A1 Dec. 13, 2001

Related U.S. Application Data

(60) Provisional application No. 60/191,853, filed on Mar. 24, 2000.

(51) Int. Cl.[7] .......................... G06F 13/28; G06F 12/06
(52) U.S. Cl. .................. 710/35; 711/217; 365/189.01; 365/189.08
(58) Field of Search .................. 711/167, 168, 711/217; 710/35; 365/189.01, 189.18, 190, 233

(56) References Cited

U.S. PATENT DOCUMENTS 5,808,958 A * 9/1998 Vogley et al. .............. 365/233
6,021,478 A * 2/2000 Kerstein et al. ............ 711/167

OTHER PUBLICATIONS

Hitachi Releases 4–Mbit Low–Power SRAMs Offering Low–Voltage, Low–Current, and High–Speed Operation. [Online] http://global.hitachi.com/ New/cnews/E/2000/000124B.html, Jan. 24, 2000.*

* cited by examiner

Primary Examiner—B. James Peikari
(74) Attorney, Agent, or Firm—Christopher P. Maiorana, P.C.

(57) ABSTRACT

A device generally comprising a memory array and a burst sequence generator. The memory array may be configured to store data. The burst sequence generator may be configured to generate a burst sequence in response to address information received by the device. The burst sequence may be configured to identify a plurality of locations for storing data in the memory array. The device may have a maximum operating current of 50 milliamps and/or a maximum standby current of about 25 microamps.

20 Claims, 6 Drawing Sheets

STATE TRANSITIONS = SCE, SWE, ADV

STATE TRANSITIONS = SCE, SWE

READ CYCLE TIMING

WRITE CYCLE TIMING

BURST READ/WRITE TIMING

WRITE/READ CYCLE TIMING

METHOD AND DEVICE FOR PERFORMING WRITE OPERATIONS TO SYNCHRONOUS BURST MEMORY

CROSS REFERENCE TO RELATED APPLICATIONS

This application claims the benefit of U.S. Provisional Application Ser. No. 60/191,853, filed Mar. 24, 2000, which is hereby incorporated by reference in its entirety.

FIELD OF THE INVENTION

The present invention relates to a method and/or architecture for a random access memory device generally and, more particularly, to a synchronous random access memory device having a burst transfer capability.

BACKGROUND OF THE INVENTION

Certain microprocessors and memory devices are designed to transfer data using a burst type transfer. The burst type transfer causes the data to be transferred at multiple consecutive addresses without having to present all addresses to the memory device. The burst type transfers may be use a linear sequence where the data at consecutive addresses ate serially transferred. The burst type transfers may use an interleaved sequence where the data at interleaved addresses are serially transferred.

SUMMARY OF THE INVENTION

The present invention concerns a device comprising a memory array and a burst sequence generator. The memory array may be configured to store data. The burst sequence generator may be configured to generate a burst sequence in response to address information received by the device. The burst sequence may be configured to identify a plurality of locations for storing data in the memory array. The device may have a maximum operating current of 50 milliamps and/or a maximum standby current of about 25 microamps.

The objects, features and advantages of the present invention include providing a synchronous burst random access memory that may (i) operate in a linear burst sequence, (ii) operate in an interleaved burst sequence, (iii) support single read accesses, (iv) support single write accesses, (v) consume extremely low power, and/or (vi) interface with a memory controller with minimal glue logic.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally concerns a synchronous static random access memory with a burst sequence capability. The burst sequence capability may provide high bandwidth using a synchronous interface while providing extremely low power consumption.

Figure 1:
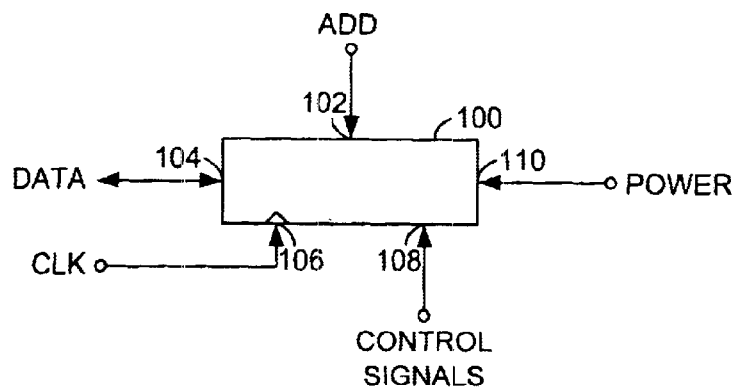
FIG. 1 is a block diagram of the present invention.

Referring to FIG. 1, a block diagram of a memory device 100 is shown according to a preferred embodiment of the present invention. The memory device 100 may have an input 102 for receiving a signal (e.g., ADD). The memory device 100 may have an input/output interface 104 for receiving and presenting a signal (e.g., DATA). The memory device 100 may have another input 106 for receiving a signal (e.g., CLK). The memory device 100 may have an input 108 for receiving a group of signals (e.g., CONTROL SIGNALS). The memory device 100 may have an input 110 for receiving power.

The signal CLK may serve as a clock used to establish synchronization. The synchronization may be to either a rising edge or a falling edge of the signal CLK. The signal CLK may be implemented as a periodic signal having an approximately 50% duty cycle. Other duty cycles may be implemented to meet the design criteria of a particular application. The input 106 may also be referred to as an input CLK.

The signal ADD may serve as an address signal. The signal ADD may be a synchronous type input signal sampled by the memory device 100 on a rising edge of the signal CLK. In a preferred embodiment, the signal ADD may be implemented as an eighteen-bit wide address. Consequently, the input 102 may be implemented as eighteen discrete input lines collectively referred to as an input A.

The signal DATA may serve as data words. The signal DATA may be a synchronous type bidirectional signal. As a synchronous type input signal, the signal DATA may be sampled by the memory device 100 on a rising edge of the signal CLK. As a synchronous type output signal, the signal DATA may become valid a delay time after a rising edge of the signal CLK. In a preferred embodiment, the signal DATA may be implemented as 32-bit wide data. Consequently, the input/output 104 may be implemented as thirty-two discrete bidirectional lines collectively referred to as an interface DG. The signal DATA generally comprises read data during read cycles and write data during write cycles.

The signal CONTROL SIGNALS may serve as a configuration, enable, and/or mode signal that direct operations of the memory device 100. The signal CONTROL SIGNALS may be a collection of several signals (e.g., SCE, OE, ADV, SWE, MODE, ZZ, B3, and L3). The signals SCE, OE, ADV, SWE, MODE, ZZ, B3, and L3 may be received at input 108 on discrete lines (shown in more detail in FIG. 2). The discrete lines for the signals SCE, OE, ADV, SWE, MODE, ZZ, B3, and L3 may be referred to as inputs /SCE, /OE, /ADV, /SWE, MODE, ZZ, B3, and L3 respectively.

The prefix "/" to the alphanumeric reference for an input generally indicates that the respective input is considered active low. An active low input may also be indicated by a bar over the alphanumeric reference of the input.

The signal SCE may serve as a synchronous chip enable signal. The signal SCE may be a synchronous type input signal sampled by the memory device 100 on the rising edge of the signal CLK. In a preferred embodiment, the signal SCE may be asserted in a logical LOW state and deasserted in a logical HIGH state. While the signal SCE is in the logical LOW state, the memory device 100 may store the signal ADD. The signal SCE is generally used to initiate all read and write operations for the memory device 100.

The signal OE may serve as an output enable signal. The signal OE may be an asynchronous type input signal independent of the signal CLK. In a preferred embodiment, the signal OE may be asserted in the logical LOW state and deasserted in the logical HIGH state. While the signal OE is in the logical LOW state, the interface 104 (interface DQ) may behave as an output to present the data read from the memory device 100. While the signal OE is in the logical HIGH state, the interface 104 may behave as a tri-state or three-state input to receive the data being written into the memory device 100.

The signal ADV may serve as an advance signal. The signal ADV may be a synchronous type input signal by the memory device 100 on a rising edge of the signal CLK. In one embodiment, the signal ADV may be asserted in the logical LOW state and deasserted in the logical HIGH state. While the signal ADV is in the logical LOW state, the memory device 100 may internally increment the signal ADD during a burst sequence. In an alternative embodiment, the signal ADV may unused during normal functioning of the memory device 100.

The signal SWE may serve as a synchronous write enable signal. The signal SWE may be a synchronous type input signal sampled by the memory device 100 on a rising edge of the signal CLK. The signal SWE may be asserted in the logical LOW state and deasserted in the logical HIGH state. While the signal SWE is in the logical LOW state, the memory device 100 may initiate a write cycle. The memory device 100 may ignore the signal SWE while the signal SWE is in the logical HIGH state.

The signal MODE may serve as a mode control signal. The signal MODE may be a static type input signal strapped to either the logical LOW state or the logical HIGH state at all times. In an alternative embodiment, the logical HIGH state may be achieved by floating the input MODE. While the signal MODE is in the logical LOW state, the memory device 100 may operate with a linear burst sequence. While the signal MODE is in the logical HIGH state, the memory device 100 may operate with an interleaved burst sequence.

The signal ZZ may serve as a snooze signal. The signal ZZ may be an asynchronous type input signal independent of the signal CLK. The signal ZZ may be asserted in the logical HIGH state and deasserted in the logical LOW state. While the signal ZZ is in the logical HIGH state, the memory device 100 may be placed in a low power consumption standby mode. While the signal ZZ is in the logical LOW state, the memory device 100 may be placed in a normal operation mode. If the input ZZ is left not connected, then the signal ZZ may default to the logical LOW state.

The signals B3 and L3 may serve as a burst counter selection signal. The signals B3 and L3 may be static type input signals strapped to either the logical LOW state or the logical HIGH state at all times. In one embodiment, the signals B3 and L3 generally determine a size of a burst sequence. In an alternative embodiment, the signals B3 and L3 may not be required.

The power may be divided into one set of power for inputs and outputs (I/O) of the memory device 100 and another set of power for a core of the memory device 100. The power for I/O may include a source (e.g., $V_{DD}$) and a ground (e.g., $V_{SS}$). The power for the core may include another source (e.g., $V_{DDQ}$) and another ground (e.g., $V_{SSQ}$). A summary of the signals is provided in TABLE 1.

TABLE 1

| Name | I/O | Description |
| --- | --- | --- |
| $A_{[17:0]}$ | Input-Synchronous | Address Inputs used to select one of the (262, 144 or 524, 288) address locations. Sampled at the rising edge of the CLK if $\overline{SCE}$ is sampled active. $A_{[1:0]}$ are also fed into the Burst counter and used to increment through the burst sequence when $\overline{ADV}$ is asserted. |
| $DQ_{[31:0]}$ | I/O-Synchronous | Bidirectional Data I/O lines. As inputs, they feed into an on-chip data register that is triggered by the rising edge of CLK. As outputs, they deliver the data contained in the memory location specified by $A_{[17:0]}$. The direction of the pins is controlled by $\overline{OE}$ and the internal logic of the device. When $\overline{OE}$ is asserted LOW, the pins can behave as outputs. When HIGH, $DQ_{[0:31]}$ are placed in a three-state condition. |
| CLK | Input-Clock | Clock Input. Used to capture all synchronous inputs to the device. |
| $\overline{SCE}$ | Input-Synchronous | Synchronous Chip Enable, active LOW, sampled on the rising edge of CLK. When asserted LOW, $A_{[x:0]}$ is captured in the address registers. $A_{[1:0]}$ are also loaded into the burst counter. $\overline{SCE}$ is used to initiate all Read and Write accesses. |
| $\overline{OE}$ | Input-Asynchronous | Output Enable, asynchronous input, active LOW. Controls the direction of the I/O pins. When LOW, the I/O pins behave as outputs. When deasserted HIGH, I/O pins are three-stated, and act as input data pins. $\overline{OE}$ is masked during the beginning of a read cycle when emerging from a deselected state. Data is not driven until after /CE is driven high. |
| $\overline{ADV}$ | Input-Synchronous | Advance Input signal. Not used during normal functioning of the device. This could be used in future revisions of the device. |
| $\overline{SWE}$ | Input-Asynchronous | Synchronous Write Enable Input. When asserted LOW on the rising edge of CLK. to initiate a write cycle, SWE is asserted at the start if a write cycle only. When $\overline{SCE}$ is deasserted HIGH, $\overline{SWE}$ is ignored. |
| ZZ | Input-Asynchronous | Snooze: This active HIGH input puts the device in low power consumption standby mode. For normal operation, this input has to be either LOW or NC (No Connect). |
| MODE | Input-Static | Selects Burst Order. When tied to GND selects linear burst sequence. When tied to $V_{DDQ}$ or left floating selects interleaved burst sequence. This is a strap pin and should remain static during device operation. |

TABLE 1-continued

| Name | I/O | Description |
|---|---|---|
| NC | No Connect | No Connect. Some of these pins are not connected to the die. Pins B3, L3 are used as strap pins to select the type of burst (1, 4, 8 or continous). These pins are read on reset. |
| $V_{DD}$ | Power Supply | Power supply inputs to the core of the device. |
| $V_{SS}$ | Ground | Ground for the core of the device. Should be connected to ground of the system. |
| $V_{DDQ}$ | Power Supply | Power supply inputs to the I/O's of the device. |
| $V_{SSQ}$ | Ground | Ground for the I/O's of the device. Should be connected to ground of the system. |

Figure 2:
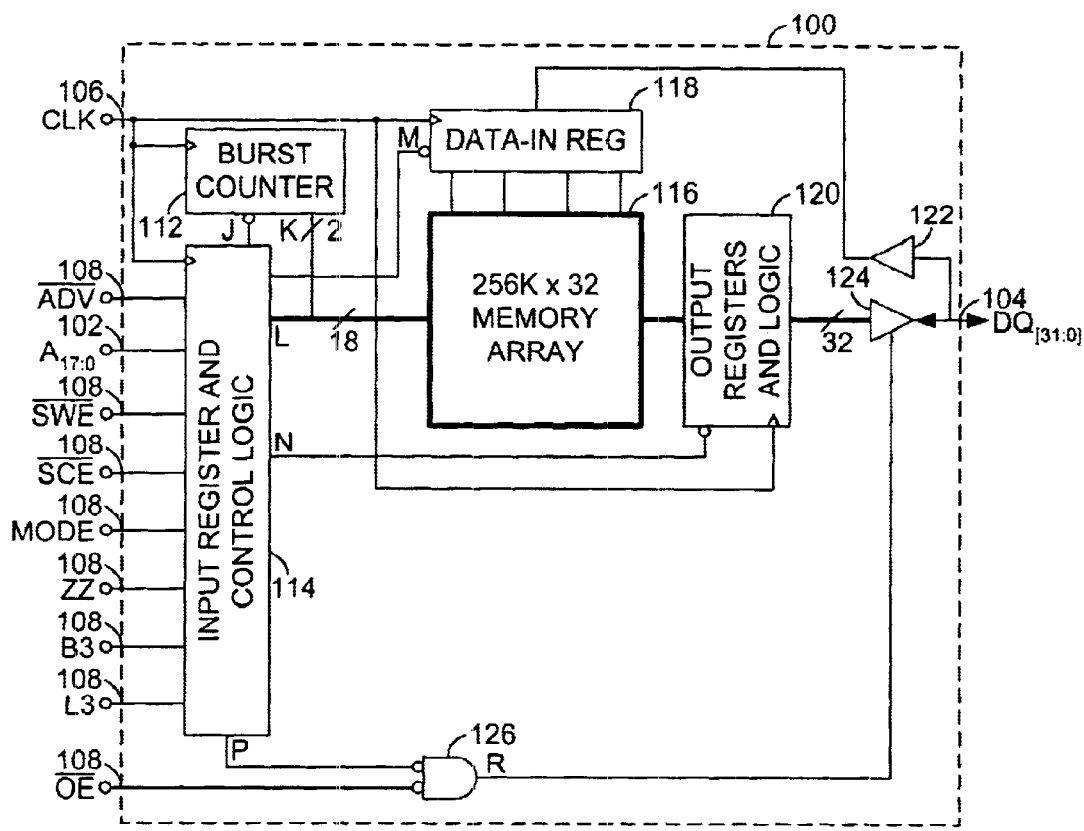
FIG. 2 is a detailed block diagram of the present invention.

Referring to FIG. 2, a detailed block diagram of the memory device 100 is shown. The memory device 100 generally comprises a number of circuits 112, 114, 116, 118, 120, 122, 124, and 126. Other configurations of the memory device 100 may be implemented to meet the design criteria of a particular application.

The circuit 112 may serve as a burst sequence generator. In a preferred embodiment, the circuit 112 may be implemented as a burst counter. The burst counter 112 may receive the signal CLK. The burst counter 112 may receive a signal (e.g., J) from the circuit 114. The burst counter may present a signal (e.g., K) to the circuit 116. The signal K may be appended to a signal (e.g., L) presented by the circuit 114 to present a signal (e.g., KL) to the circuit 116. The signal KL may serve as an address to the circuit 116.

The circuit 114 may serve as an input register and control logic. The input register 114 may receive the signals CLK, ADV, ADD, SWE, SCE, MODE, ZZ, B3 and L3. The input register 114 may present the signal J to the burst counter 112 and the signal L to the circuit 116. The input register 114 may present a signal (e.g., M) to the circuit 118, a signal (e.g., N) to the circuit 120, and another signal (e.g., P) to the circuit 126.

The circuit 116 may serve as a memory array having multiple locations for storing the write data. The memory array 116 may receive the signal KL from the burst counter 112 and the input register 114. The array may receive the write data buffered by the circuit 118. The memory array 116 may present the read data to the circuit 120 for buffering. In a preferred embodiment, the memory array 116 may be implemented as a 32-bit wide by at least 256 K array. Other dimensions of the memory array 116 may be implemented to meet the design criteria of a particular application.

The circuit 118 may serve as a data input register. The data-in register 118 may receive the signal CLK. The data-in register 118 may receive the write data from the circuit 122 and the signal M from the input register 114. The data-in register 116 may present the write data to the memory array 116.

The circuit 120 may serve as an output register and logic. The output register 120 may receive the signal CLK. The output register 120 may also receive the signal N from the input register 114 and the read data from the memory array 116. The output register 120 may present the read data as buffered to the circuit 124.

The circuit 122 may serve as an input buffer amplifier connected to the interface DQ. The input driver 122 may receive the signal DATA. The input buffer amplifier may present the write data from the signal DATA to the data-in register 118.

The circuit 124 may serve as an output buffer amplifier connected to the interface DQ. The output driver 124 may receive the read data from the output register 120 and a signal (e.g., R) from the circuit 126. The signal R may be asserted to the logical HIGH state and deasserted to the logical LOW state. While the signal R is in the logical HIGH state, the output driver 124 may present the read data at the interface DQ as the signal DATA. While the signal R is in the logical LOW state, the output driver 124 may appear as a high impedance at the interface DQ.

The circuit 126 may serve as a logical NOR function. The circuit 126 may receive the signal P from the input register 114 and the signal OE. The circuit 126 may present the signal R to the output driver 124. The circuit 126 generally presents the signal R in the logical HIGH state when the signals P and OE are both in the logical LOW state. The circuit 126 generally presents the signal R in the logical LOW state for all other combinations of the signals P and OE in the logical HIGH and the logical LOW states.

The signal J may serve as a starting point for the burst counter 112. The signal J is generally address information comprising two or three least-significant bits of the signal ADD depending upon the length of the burst. During a burst sequence, the signal K may start equal to the signal J. At each rising edge of the signal CLK, the burst counter 112 steps the signal K in a linear or interleaved fashion depending upon the signal MODE. The signal L may be additional address information comprising all except the two or three least-significant bits of the signal ADD. The combination of the two or three least-significant bits from the signal K and the other bits from the signal L create a complete address (e.g., the signal KL) for the memory array 116.

The signals M, N and P may serve as controls signals to the data-in register 118, the output register 120, and the circuit 126 respectively. The signal R may serve as a control signal to the output driver 124. The signals M, N, P, and R may be asserted in the logical LOW state and deasserted in the logical HIGH state.

All synchronous inputs may pass through the registers 114 and 118 controlled by the rising edge of the signal CLK. All data outputs may pass through the output register 120 controlled by the rising edge of the signal CLK for pipelined operation. Read accesses may be pipelined through the data-in register 118 and the output register 120. This generally provides a 2-stage pipelined read operations. The signal SCE may be provided to deselect the memory device 100 when not used. The memory device 100 may be in a low power mode when deselected. All write accesses may be controlled with internal self-timed write operations.

Figure 3:
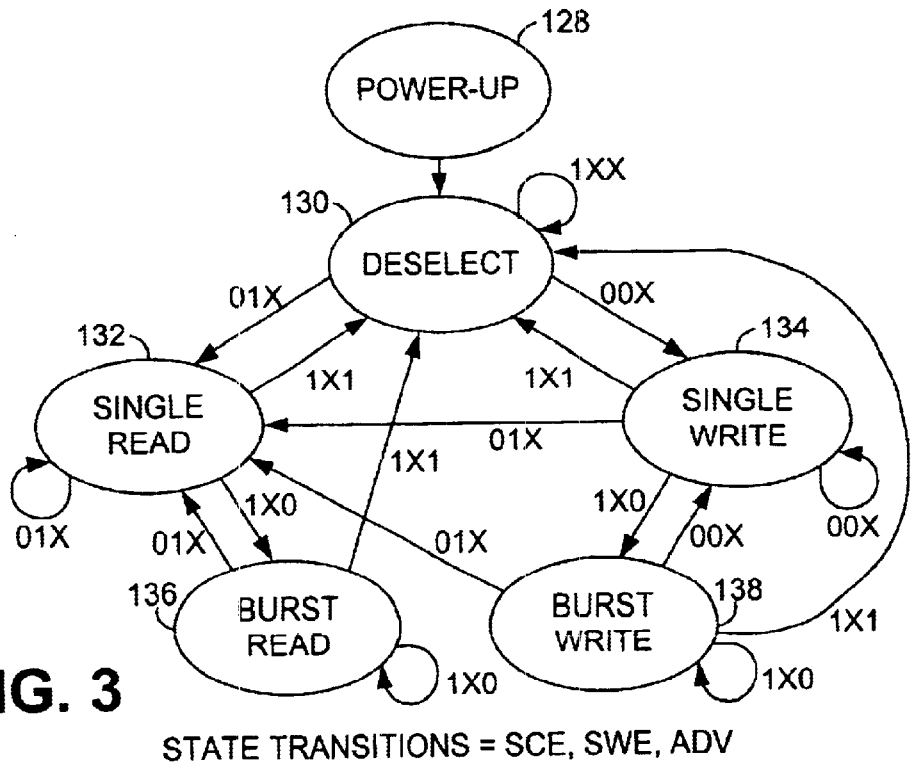
FIG. 3 is a state transition diagram.

Referring to FIG. 3, a state transition diagram is shown in accordance with one embodiment of the present invention. The three characters on each state transition line refer to the signals SCE, SWE and ADV from left to right. A truth table for the state transition lines may be seen in TABLE 2. The logical LOW and the logical HIGH states are generally represented in FIG. 3 and TABLE 2 as "0" and "1" respectively.

TABLE 2

| SCE | SWE | ADV | Inputs/Outputs | Mode |
|---|---|---|---|---|
| 0 | 0 | X | High-Z | Single Write |
| 0 | 1 | X | Data-out | Single Read |
| 1 | X | 0 | Data-out | Burst Read |
| 1 | X | 0 | High-Z | Burst Write |
| 1 | X | 1 | High-Z | Deselected |

The memory device 100 may initialize in a power-up state 128. After initialization, the memory device 100 may be automatically transition to a ready or deselect state 130. As long as the signal SCE remains in the logical HIGH state, the memory device 100 may remain in the deselect state 130. The memory device 100 may transition to a single write state 132 when the signal SCE is in the logical LOW state and the signal SWE is in the logical HIGH state. The memory device 100 may transition to a signal write state 134 when the signal SCE is in the logical LOW state and the signal SWE is in the logical LOW state.

The memory device 100 generally remains in the single read state 132 as long as the signal SCE remains in the logical LOW state and the signal SWE remains in the logical HIGH state. The memory device 100 may transition to the deselect state 130 when the signal SCE is in the logical HIGH state and the signal ADV is in the logical HIGH state. The memory device may transition to a burst read state 136 when the signal SCE is in the logical HIGH state and the signal ADV is in the logical LOW state.

The memory device 100 generally remains in the burst read state 136 as long as the signal SCE remains in the logical HIGH state and the signal ADV remains in the logical LOW state. The memory device 100 may transition to the signal read state 132 when the signal SCE is in the logical LOW state and the signal SWE is in the logical HIGH state. The memory device 100 may transition to the deselect state 130 when the signals SCE and ADV are both in the logical HIGH state.

The memory device 100 may remain in the signal write state 134 while the signals SCE and SWE are both in the logical LOW state. The memory device 100 may transition to the deselect state 130 when the signals SCE and ADV are both in the logical LOW state. The memory device 100 may transition to the signal read state 132 when the signal SCE is in the logical LOW state and the signal SWE is in the logical HIGH state. The memory device 100 may transition to a burst write state 138 when the signal SCE is in the logical HIGH state and the signal ADV is in the logical LOW state.

The memory device 100 generally remains in the burst at write state 138 as long as the signal SCE remains in the logical HIGH state and the signal ADV remains in the logical LOW state. The memory device 100 may transition back to the signal write state 134 when the signals SCE and SWE are both in the logical LOW'state. The memory device 100 may transition to the signal read state 132 when the signal SCE is in the logical LOW state and the signal SWE is in the logical HIGH state.

All read and write accesses to the memory device 100 are generally initiated as single accesses. Asserting the signal ADV may initiate a burst sequence. The burst sequence is generally controlled by the state of the signal MODE. The least significant address bits (e.g., A[1:0] of A[2:0]) represented by signal J may provide a starting location for the burst sequence. Therefore, critical word first operations may be supported since all memory locations in the memory array 116 are available to the user. Incremented sufficiently, the burst counter 112 may wrap the signal K around the four or eight words.

A "critical word first" may refer to any word in the memory array 116 that may be accessed at a particular time. Other burst devices include a burst sequence configured such that the data words are presented in a specific order (e.g., 1-2-3-4). The words are presented in the specific order because, for example, of the four address locations for the four data words, only address location 1 is accessible. Therefore, if word 3 is needed, a delay occurs while words 1 and 2 are first accessed before word 3 is accessed. While this type of burst sequence generator may be suitable for use in the present invention, a burst sequence generator that is configured to access any location in the memory array as an initial address (and thus, that supports critical word first operations) is preferred. The above reasoning may also apply to eight-word bursts.

Figure 4:
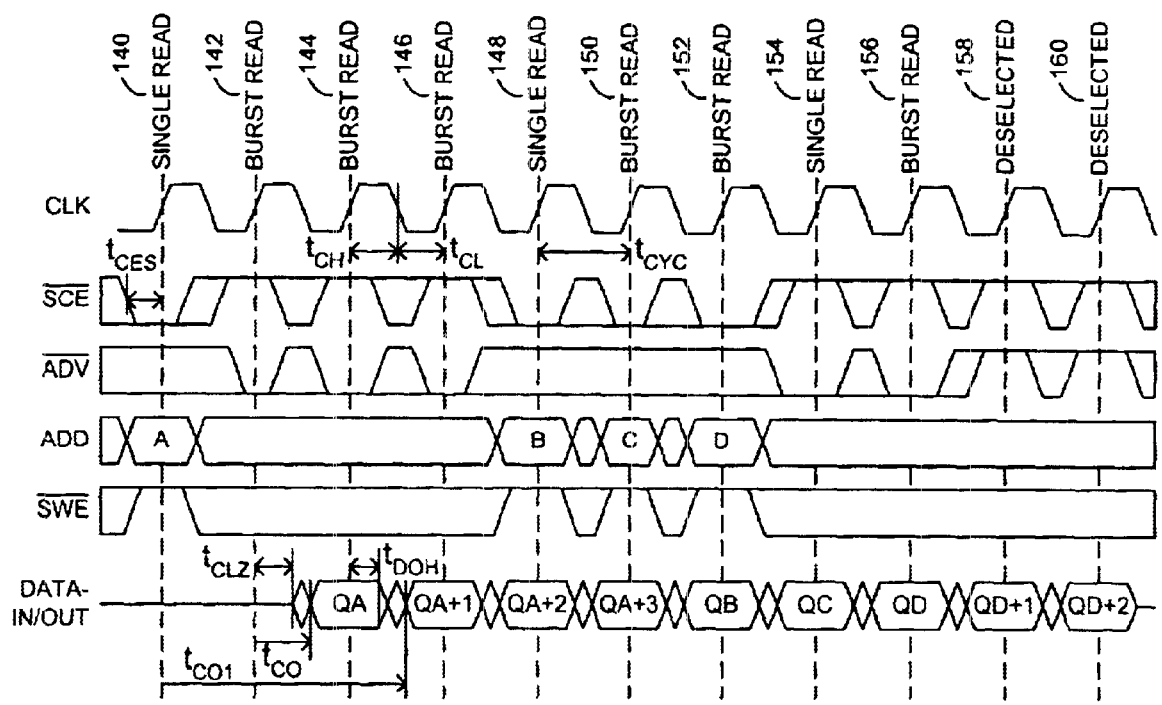
FIG. 4 is a timing diagram showing a single read access and a burst read sequence.

Referring to FIG. 4, a timing diagram of single read and burst read cycles are shown in accordance with the state transition diagram shown in FIG. 3. Read accesses are initiated when the following conditions are satisfied at clock rise (e.g., at time 140): (1) the signal SCE is asserted active in the logical LOW state, and (2) the signal SWE is deasserted in the logical HIGH state. The signal ADD representing an address (e.g., A) received at the inputs A[17:0] may be stored into the input register 114 and the signal J may be presented to the burst counter 112. The memory device 100 is generally a 2-stage pipelined SRAM. Therefore, the read data at the address A (e.g., QA) may be presented at the interface DQ within 12 ns (50 MHz) (e.g., time delay tco) following the next clock rise of the signal CLK (e.g., at time 142), if the signal OE is asserted in the logical LOW state. The read data QA may then be held valid at the interface DQ during the next rising clock edge (e.g., at time 144) for latching into other circuits external to the memory device 100 such as a memory controller. After the first cycle of the access, the output driver 124 may be controlled by the signal OE.

The memory device 100 may increment through the remaining words of a 4-word burst on the rising edges of the clock signal CLK (e.g., at times 142, 144 and 146) if the signal ADV is asserted in the logical LOW state. The burst sequence (e.g., linear or interleave) is generally determined by the state of the signal MODE. Read accesses may be pipelined such that the read data (e.g., QA+1, QA+2 and QA+3) will be presented by the memory device 100 during every subsequent rising edge of the clock signal CLK (e.g., at times 146, 148, and 150).

In another example, the signal ADD may be changed (e.g., B, C, and D) during three consecutive clock cycles (e.g., times 148, 150 and 152). The read cycles for the addresses B and C may be single reads. The read data (e.g., QB and QC) stored at addresses B and C may be presented at the interface DQ at subsequent times (e.g., times 152 and 154) respectively. The address D may be a start to another burst read sequence. The read data (e.g., DQ, DQ+1, DQ+2) may be presented during sequential clock cycles (e.g., cycles starting at times 156, 158, and 160).

Wait states may be added to the read access of the memory device 100. The wait states may be implemented by maintaining the signal SCE in the logical LOW state after the initiation of a read operation without changing the signal ADD. Doing so may initiate a second single read access to the same address location. General switching characteristics for the memory device 100 at a clock frequency of 50 MHz and 33 MHz are shown in TABLE 3.

TABLE 3

| Parameter | Description | −50 MHz Min. | −50 MHz Max. | −33 Mhz Min. | −33 Mhz Max. | Unit |
|---|---|---|---|---|---|---|
| Clock Times | | | | | | |
| $t_{CYC}$ | Clock Cycle Time | | 20 | | 30 | ns |
| $t_{CH}$ | Clock HIGH | 7 | | 10 | | ns |
| $t_{CL}$ | Clock LOW | 7 | | 10 | | ns |
| Access Times | | | | | | |
| $t_{CO}$ | Clock to Data Valid | | 12.0 | | 15.0 | |
| $t_{CO1}$ | Read Initiated to First Data Output Valid | | 32 | | 45 | ns |
| $t_{EOV}$ | $\overline{OE}$ LOW to Output Valid[6] | | 12.0 | | 15.0 | ns |
| Set-up Times | | | | | | |
| $t_{AS}$ | Address Set-Up Before CLK Rise | 4 | | 5 | | ns |
| $t_{SWES}$ | $\overline{SWE}$ Set-Up Before CLK Rise | 4 | | 5 | | ns |
| $t_{DS}$ | Data Input Set-Up Before CLK Rise | 4 | | 5 | | ns |
| $t_{CES}$ | Chip enable Set-Up | 4 | | 5 | | ns |
| Hold Times | | | | | | |
| $t_{AH}$ | Address Hold After CLK Rise | 1 | | 1 | | ns |
| $t_{SWEH}$ | $\overline{SWE}$ Hold After CLK Rise | 1 | | 1 | | ns |
| $t_{DH}$ | Data Input Hold After CLK Rise | 1 | | 1 | | ns |
| $t_{CEH}$ | Chip enable Hold After CLK Rise | 1 | | 1 | | ns |
| Output Times | | | | | | |
| $t_{DOH}$ | Data Output Hold After CLK Rise | 2 | | 2 | | ns |
| $t_{CHZ}$ | Clock to High-Z[6,7,8] | | 2 | | 2 | ns |
| $t_{CLZ}$ | Clock to Low-Z[6,7,8] | 1 | | 1 | | ns |
| $t_{EOHZ}$ | $\overline{OE}$ HIGH to Output High-Z[6,8] | | 5 | | 5 | ns |
| $t_{EOLZ}$ | $\overline{OE}$ LOW to Output Low-Z[6,8] | 0 | | 0 | | ns |

Notes:
[5]Unless otherwise noted, test conditions assume signal transition time of 5 ns or less, timing reference levels of 0.8 V, input pulse levels of 0 to 1.6 V, and output loading of the specified IOL/IOH and load capacitance. Shown in (a) and (b) of AC test loads.
[6]tCHZ, tCLZ, tOEV, tEOLZ, and tEOHZ are specified with a load capacitance of 5 pF as in part (b) of AC Test Loads. Transition is measured ±200 mV from steady-state voltage.
[7]At any given voltage and temperature $t_{CHZ}$ is less than $t_{CLZ}$ and $t_{CHZ}$ less than $t_{CO}$.
[8]Tested initially and after any design or process change that may affect these parameters.

Figure 5:
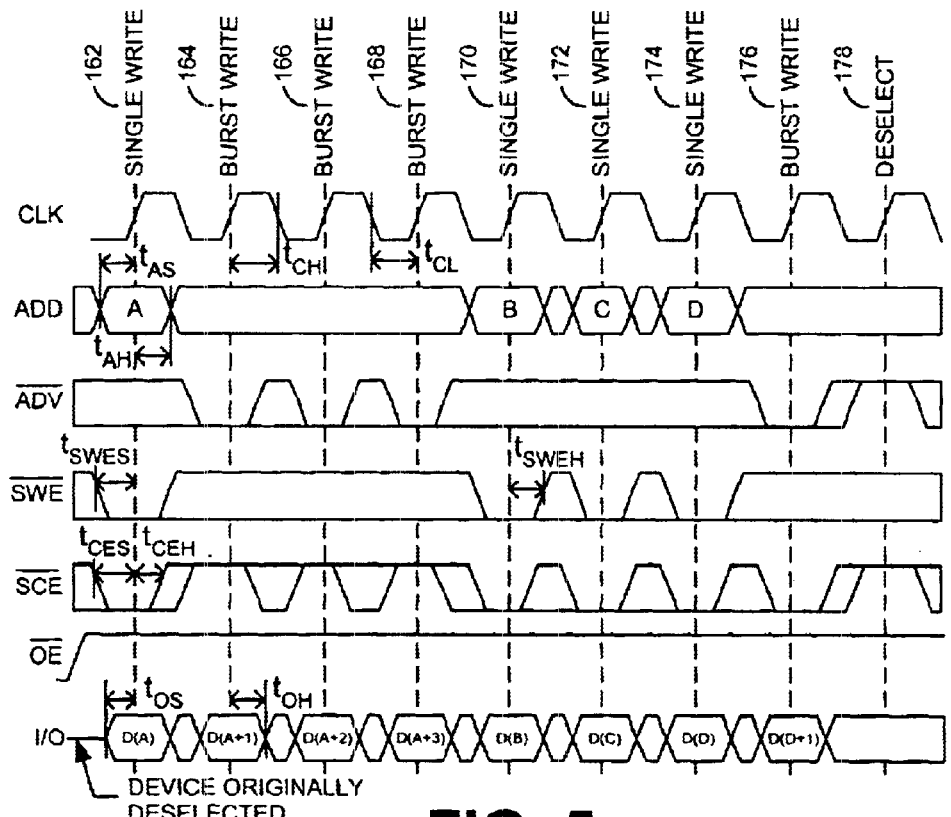
FIG. 5 is a timing diagram showing a single write access and a burst write sequence.

Referring to FIG. 5, a timing diagram of single write and burst write cycles are shown in accordance with one embodiment of the present invention. Write accesses maybe initiated when the following conditions are satisfied: (1) the signal SCE is asserted active in the logical LOW state, and (2) the signal SWE is asserted active in the logical LOW state. The signal ADD representing the address A and presented to the input A[17:0] is generally loaded into the input register 114 (e.g., at time 162). The signal J, representing the signal ADD at the input A[1:0] may also be loaded into the burst counter 112. The write data (e.g., D(A)) presented at the interface DQ may be latched into the data-in register 118 and then written into the memory array 116.

To continue the single write access as a burst write access, the burst counter 112 may be incremented and on the following three clock rises (e.g., at times 164, 166, and 168). The write data (e.g., D(A+1), D(A+2), and D(A+3)) presented to the interface DQ may be written into the memory array 116. A synchronous self-timed write mechanism between the data-in register 118 and the memory array 116 may been provided to simplify the write operations.

Another example of two consecutive single write accesses followed by a burst write access are also shown. The signal ADD may present the addresses B, C, and D during three consecutive clock cycles (e.g., cycles starting at times 170, 172 and 174). The write accesses to the addresses B and C may cause the write data (e.g., D(B) and D(C)) to be stored in the memory array 116. At another time (e.g., time 174), the signal ADD may present the address D as the first address of another burst write sequence. Consequently, the write data (e.g., D(D) and D(D+1)) may be latched into the data-in register 118 at consecutive rising clock edges (e.g., at times 174 and 176). At the next rising clock edge (e.g., at time 178) the signal ADV may be in the logical HIGH state transitioning the memory device 100 back to the deselected state 130 after only a two-cycle burst write operation.

Because the memory device 100 may be a common I/O device, the signal OE may be deasserted to the logical HIGH state before presenting write data to the interface DQ. Doing so will generally three-state the output driver 124. As a safety precaution, the output driver 124 may be automatically three-stated whenever a write cycle is detected, regardless of the state of the signal OE.

Figure 6:
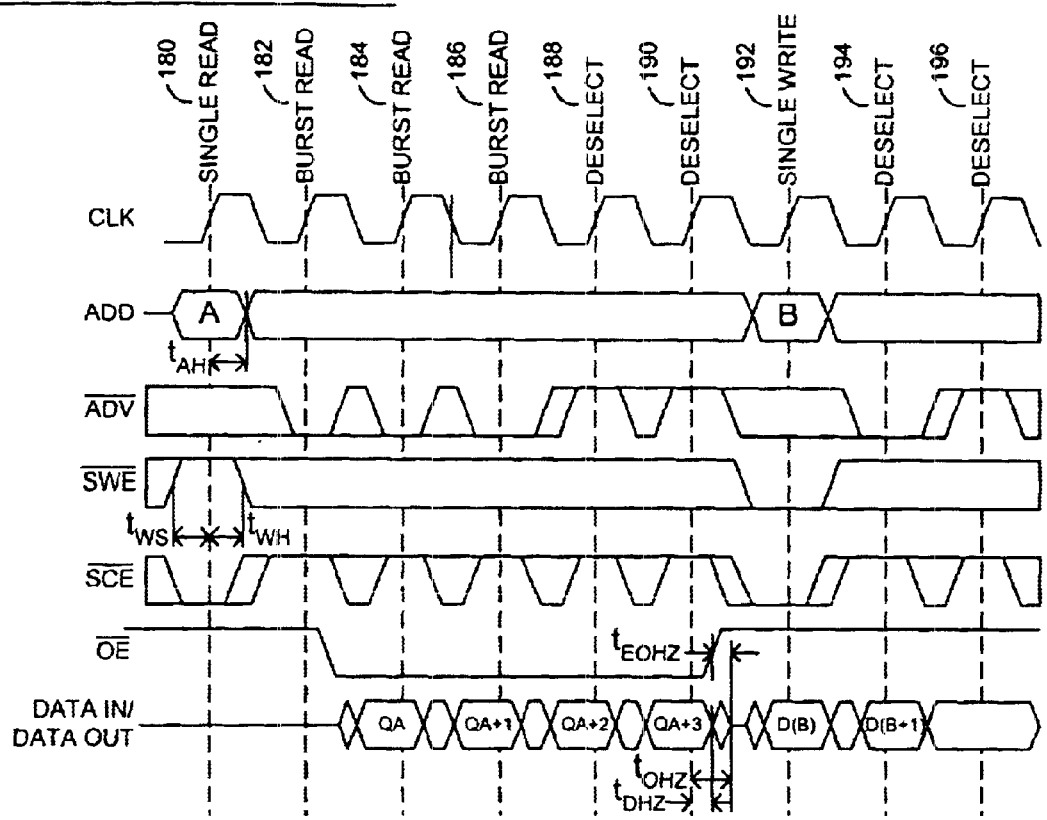
FIG. 6 is a timing diagram showing a burst read sequence immediately followed by a burst write sequence.

Referring to FIG. 6, a timing diagram of a burst read access immediately followed by a burst write access is shown. The burst read access generally starts with a single read access (e.g., starting at time 180) at the address A. The read data QA may be presented at the interface DQ after a delay from the next rising clock (e.g., at time 182). During the next three consecutive clock cycles (e.g., cycles starting at times 184, 186 and 188) the burst read access presents the read data QA+1, QA+2 and QA+3.

After the last read data QA+3 is presented at the interface DQ, (e.g., at time 190), then the signal OE may be, deasserted in the logical HIGH state to three-state the output driver 124. The signal ADD may then present the address B to the interface A[17:0] and the associated write data (e.g., D(B)) may be presented at the interface DQ at the next rising clock edge (e.g., at time 192). During the next rising clock edge (e.g., at time is 194) additional write data (e.g., D(B+1)) may be received at the interface DQ. The signal ADV may be in the logical HIGH state at the next rising clock edge (e.g., at time 196) thus causing the memory device 100 to transition to the deselected state 130 after a two-cycle burst write.

Figure 7:
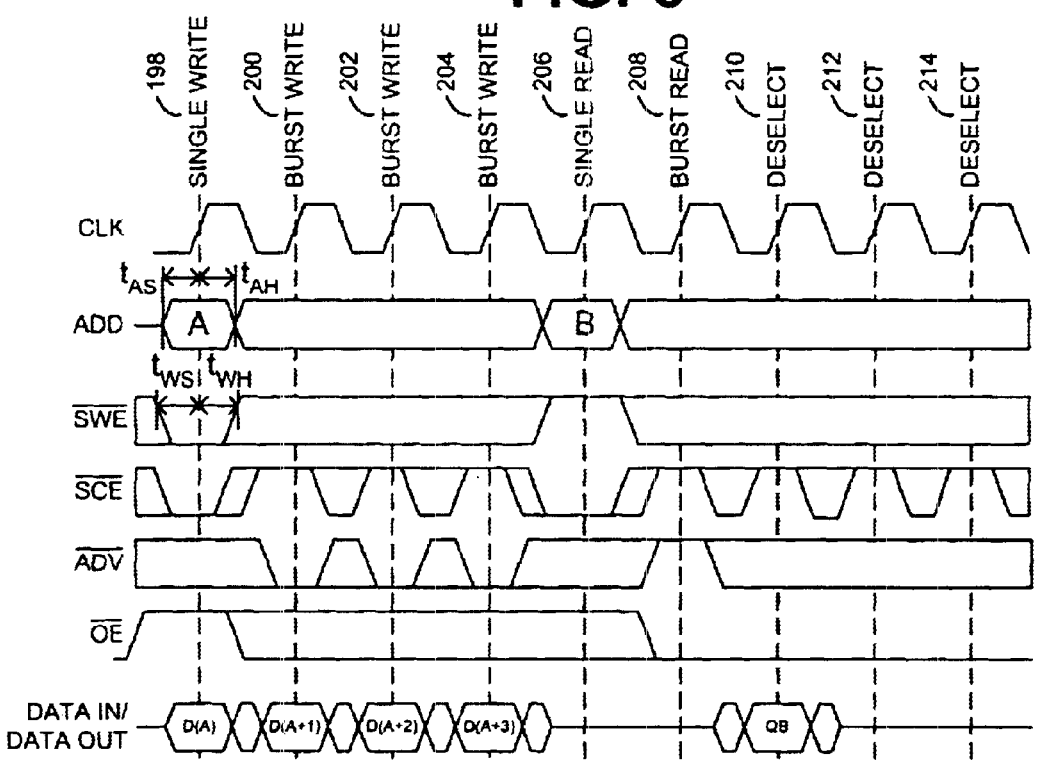
FIG. 7 is a timing diagram showing a burst write sequence immediately followed by a burst read sequence.

Referring to FIG. 7, a timing diagram of a burst write access immediately followed by a burst read access is shown. During the first clock edge and each subsequent rising clock edge (e.g., at times 198, 200, 202, and 204) write data (e.g., D(A), D(A+1), D(A+2), and D(A+3)) may be presented at the interface DQ as part of the burst write sequence. On the next rising clock edge (e.g., at time 206) the signal ADD may present the address B for a burst read sequence. The read DATA (e.g., QB) may be presented at the interface DQ starting during the nest clock cycle (e.g., starting at times 208). The signal SCE may then transition the memory device 100 to the deselect state 130 thus ending the burst read sequence after only one data item has been resented.

All read and write access to the memory device 100 are generally initiated as single accesses. Keeping the signal SCE in the logical LOW state after a first read may continue the access into a burst in a preferred embodiment. The memory device 100 generally has an option to select a number of words that can be burst. The signals B3 and L3 may be used to determine a burst size. A burst type as a function of the signals B3, L3 and MODE is shown in TABLE 4.

TABLE 4

| B3 | L3 | MODE | Type | Address Used |
|----|----|------|------|--------------|
| 0 | 0 | X | Single Reads | |
| 0 | 1 | 1 | Burst of 4 Interleaved | A[1:0] |
| 1 | 0 | 1 | Burst of 8 Interleaved | A[2:0] |
| 0 | 1 | 0 | Burst of 4 Linear | A[1:0] |
| 1 | 0 | 0 | Burst of 8 Linear | A[2:0] |
| 1 | 1 | X | Continuous Burst | A11 |

If a four-word burst is selected, the burst sequence is generally controlled by the sate of the signal MODE and a starting address is controlled by the least two significant address bits of the signal ADD. If an eight-word burst is selected, the least three significant bits of the signal ADD are generally used for the starting address. Therefore, critical word first operations may be supported since all locations in the memory array 116 may be available to a user. Incremented sufficiently, the burst counter 112 generally will wrap around.

Figure 8:
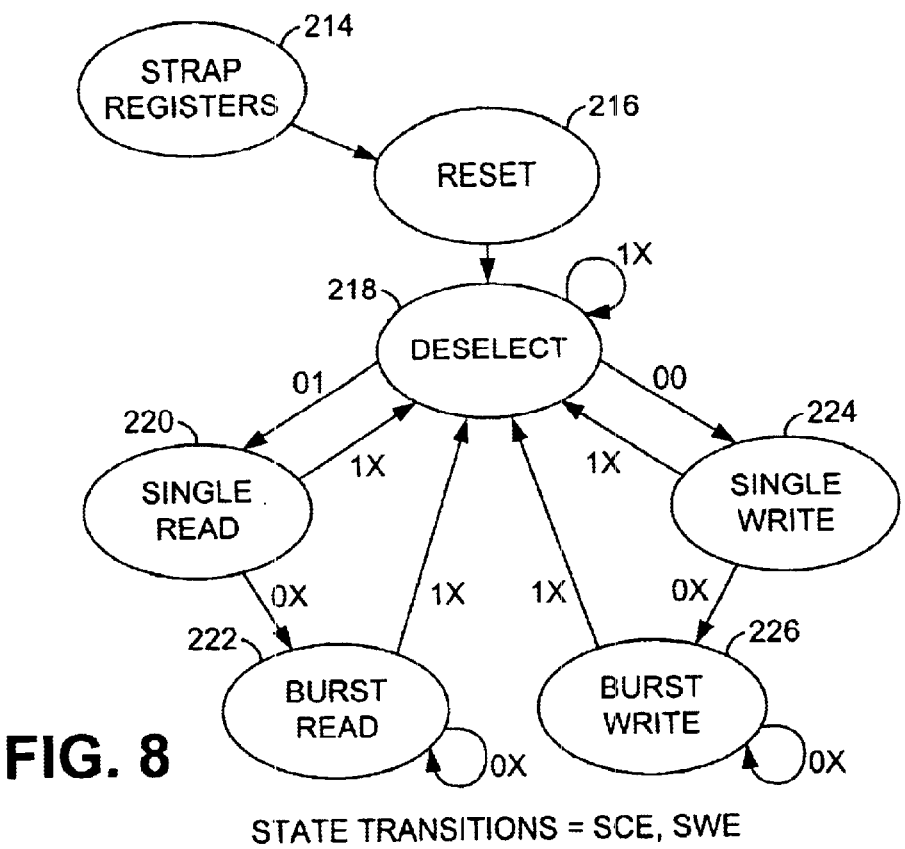
FIG. 8 is a second state transition diagram.

Referring to FIG. 8, an alternative state transition diagram is shown. The two characters on each state transition line refer to the signals SCE and SWE from left to right. The memory device 100 may initialize in a strap register state 214where signals such as B3 and L3 are sampled. The memory device 100 may then be automatically transition to a reset state 216. Once reset has completed, the memory device 100 may automatically transition to a deselect state 218. As long as the signal SCE remains in the logical HIGH state, the memory device 100 may remain in the deselect state 218.

The memory device 100 may transition to a single write state 220 when the signal SCE is in the logical LOW state and the signal SWE is in the logical HIGH state. From the single read state 220 the memory device 100 may transition back to the deselect state 218 is the signal SCE is in the logical HIGH state. From the single read state 220, the memory device 100 may transition to a burst read state 222 if the signal SCE remains in the logical LOW state after one read. The memory device 100 may remain in the burst read state 222 as long as the signal SCE remains in the logical LOW state. The memory device 100 may transition from the burst read state 222 to the deselect state 218 if the signal SCE returns to the logical HIGH state.

The memory device 100 may transition to a single write state 224 when the signal SCE is in the logical LOW state and the signal SWE is in the logical LOW state. From the single write state 224 the memory device 100 may transition back to the deselect state 218 is the signal SCE is in the logical HIGH state. From the single write state 224, the memory device 100 may transition to a burst write state 226 if the signal SCE remains in the logical LOW state after one write. The memory device 100 may remain in the burst write state 226 as long as the signal SCE remains in the logical LOW state. The memory device 100 may transition from the burst write state.226 to the deselect state 218 if the signal SCE returns to the logical HIGH state.

Figure 9:
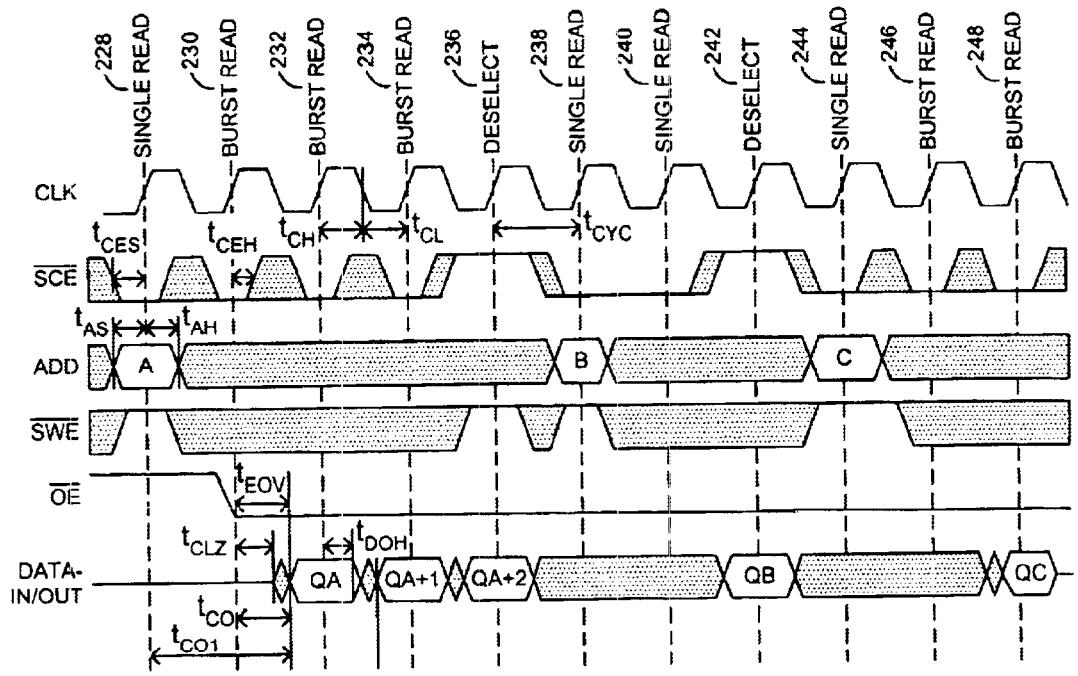
FIG. 9 is a timing diagram showing a single read access and a burst read sequence.

Referring to FIG. 9, a timing diagram of single read and burst read cycles are shown in accordance with the state transition diagram shown in FIG. 8. Read accesses are initiated when the following conditions are satisfied at clock rise (e.g., at time 228): (1) the signal SCE is asserted active in the logical LOW state, and (2) the signal SWE is deasserted in the logical HIGH state. The signal ADD representing an address (e.g., A) received at the inputs A[17:0] may be stored into the input register 114 and the signal J may be presented to the burst counter 112. The width of the signal J. The read data at the address A (e.g., QA) may be presented at the interface DQ within the time delay tco following the next clock rise of the signal CLK (e.g., at time 230), if the signal OE is asserted in the logical LOW state. The read data QA may then be held valid at the interface DQ during the next rising clock edge (e.g., at time 232) for latching into other circuits external to the memory device 100. After the first cycle of the access, the output driver 124 may be controlled by the signal OE.

The memory device 100 may be incremented through a 4-word burst, an 8-word burst, or a continuous burst if the signal SCE remains asserted in the logical LOW state. The example shown in as FIG. 9 illustrates a 4-word burst. Here, the signal SCE is in the logical LOW state on the next three rising edges of the clock signal CLK (e.g., at times 230, 232 and 234). The burst sequence (e.g., linear or interleave) is generally determined by the state of the signal MODE. Read accesses may be pipelined such that the read data (e.g., QA+1, QA+2 and QA+3) will flow out of the memory device 100 following every rising edge of the clock signal CLK (e.g., at times 234, 236, and 238).

In another example, the signal ADD may be changed (e.g., B) one clock cycle (e.g., time 238) following entering the deselect state 218 at the time 236. The read cycle for the address B may start as another single read. The read data (e.g., QB) stored at addresses B may be presented at the interface DQ following a next clock edge at a later time (e.g., time 240). The data QB may be presented at the interface DQ through the next rising clock edge (e.g., at a time 242). If the signal SCE is deasserted to the logical HIGH state at the time 240, then the read cycle may end as a single read.

In yet another example, the signal ADD may be changed (e.g., C) for another rising clock edge (e.g., at time 244). As before, the read cycle for the address C may start as a single read. The read data (e.g., QC) stored at the address C may be presented at the interface DW following the a next clock edge (e.g., at a time 246) and then held through a subsequent clock edge (e.g., at a time 248). However, the signal SCE may be in the logical LOW state at the times 246 and 248 resulting in another burst read.

Figure 10:
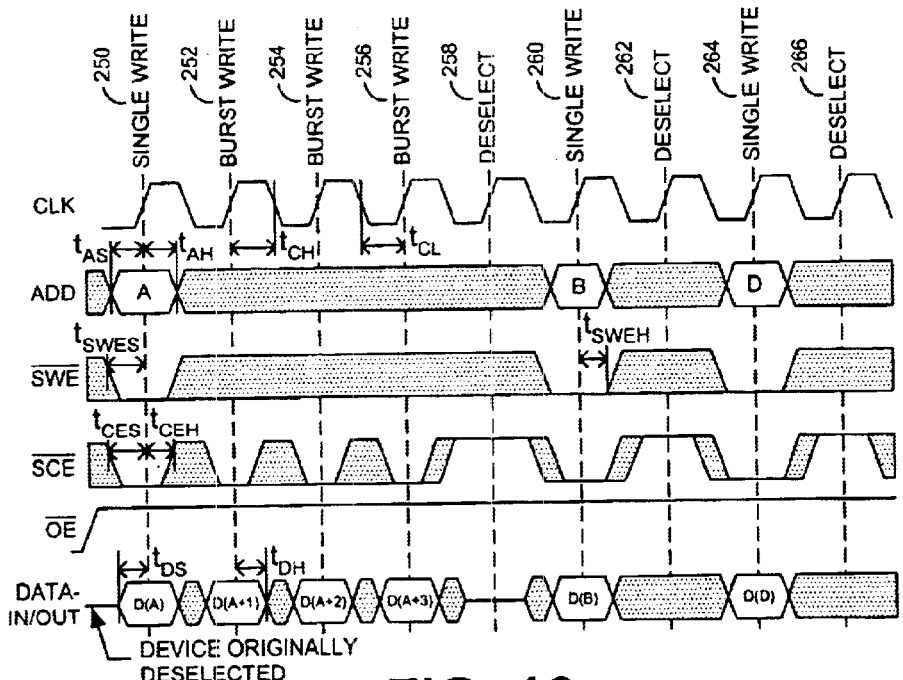
FIG. 10 is a timing diagram showing a single write access and a burst write sequence.

Referring to FIG. 10, a timing diagram of single write and burst write cycles are shown in accordance with a preferred embodiment of the present invention. Write accesses may be initiated when the following conditions are satisfied: (1) the signal SCE is asserted active in the logical LOW state, and (2) the signal SWE is asserted active in the logical LOW state. The signal ADD representing the address A and presented to the input A[17:0] is generally loaded into the input register 114 (e.g., at time 250). The signal J, representing the signal ADD at the input A[1:0] may also be loaded into the burst counter 112. The write data (e.g., D(A)) presented at the interface DQ may be latched into the data-in register 118 and then written into the memory array 116.

The signal SCE may remain in the logical LOW state to continue the single write access as a burst write access. In particular, the burst counter 112 may be incremented and on the following three clock rises (e.g., at times 252, 254, and 256). The write data (e.g., D(A+1), D(A+2), and D(A+3)) presented to the interface DQ during the times 252, 254, and 256 may be written into the memory array 116. A synchronous self-timed write mechanism 1 between the data-in register 118 and the memory array 116 may been provided to simplify the write operations. On a subsequent clock rise (e.g., at a time 258), the signal SCE may be in the logical HIGH state to end the burst by transitioning the memory device 100 to the deselect state 218.

Another example of a single write accesses is also shown. The signal ADD may present the address B one rising clock edge (e.g., at a time 260) after the memory device 100 enters the deselect state 218. The write access to the address B may cause the write data (e.g., D(B)) present at the interface DQ at the time 260 to be stored in the memory array 116. The signal SCE may return to the logical HIGH state for a next clock rise (e.g., at a time 262) to end the single write. Another single write cycle may be initiated on a next rising clock (e.g., at a time 264). At the time 264 the signal ADD may present the address D and the write data (e.g., D(D)) may be presented at the interface DQ. The single write cycle for address D may be ended on a next clock rise (e.g., at a time 266) if the signal SCE is in the logical HIGH state.

Figure 11:
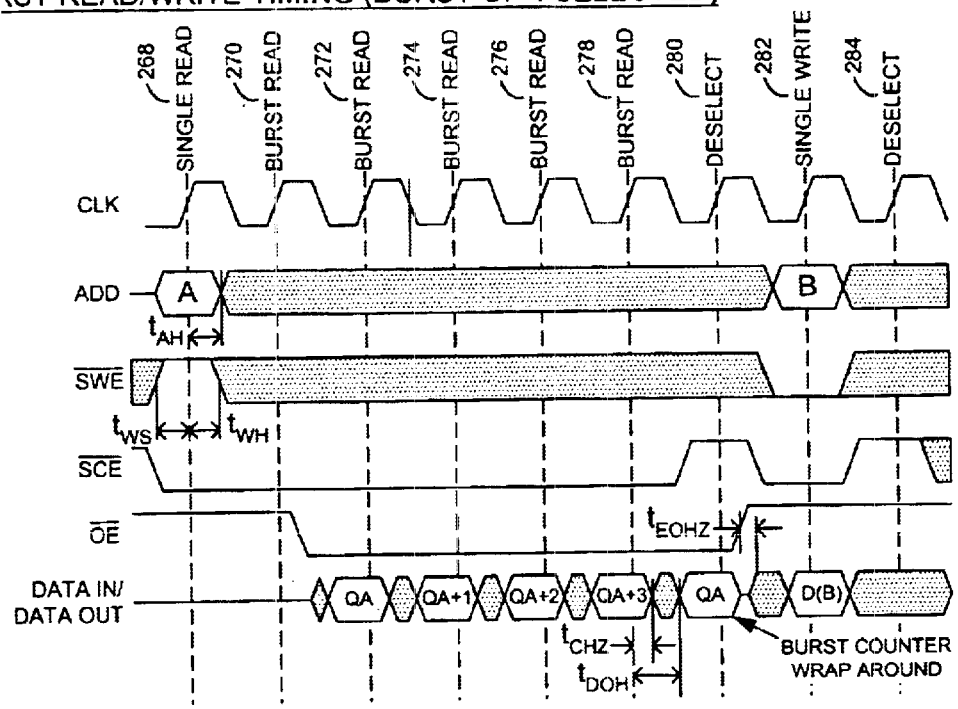
FIG. 11 is a timing diagram showing a burst read sequence immediately followed by a burst write sequence.

Referring to FIG. 11, a timing diagram of a burst read access immediately followed by a burst write access is shown. The burst read access generally starts with a single read access (e.g., starting at time 268) at the address A. During the next five consecutive clock cycles (e.g., cycles starting at times 270, 272, 274, 276, and 278) the signal SCE may be asserted in the logical LOW state to signal a burst read. The read data QA may be presented at the interface DQ after a delay from the rising clock at time 270. During the next four consecutive clock cycles starting at the times 272, 274, 276, and 278, the burst read access presents the read data QA+1, QA+2, QA+3, and QA respectively. Since the total length of the burst sequence is six clock cycles (one single read followed by five burst reads) and the burst length programmed at four, the burst counter 112 may wrap around causing the data QA to be presented as the fifth data item. The data QA+1 may not be presented a second time because the memory device 100 may transition to the deselect state 218 at the time 280.

The signal SCE may be deasserted to the logical HIGH state after the time 280 to transition the memory device 100 to the deselect state 218. After the read data QA is presented at the interface DQ for the second time past the rising clock edge at the time 280, then the signal OE may be deasserted in the logical HIGH state to three-state the output driver 124. The signal ADD may then present the address B to the interface A[17:0] and the associated write data (e.g., D(B)) may be presented at the interface DQ at the next rising clock edge (e.g., at time 282). The signals SCE and SWE may be asserted in theological LOW state at the time 282 to transition the memory device 100 to the single write state 224. During the next rising clock edge (e.g., at time 284) the signal SCE may be deasserted to the logical HIGH state to end the single write.

Figure 12:
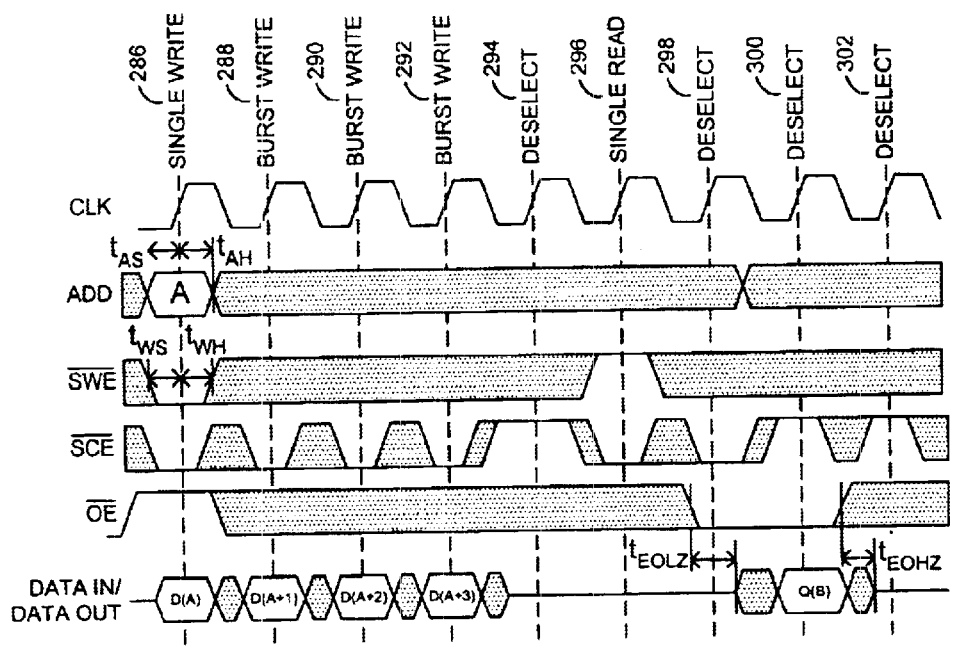
FIG. 12 is a timing diagram showing a burst write sequence immediately followed by a burst read sequence.

Referring to FIG. 12, a timing diagram of a burst write access immediately followed by a burst read access is shown. During the first clock edge and each subsequent rising clock edge (e.g., at times 286, 288, 290, and 292) write data (e.g., D(A), D(A+1), D(A+2), and D(A+3)) may be presented at the interface DQ as part of the burst write sequence. On the next rising clock edge (e.g., at time 294) the signal SCE may be deasserted to the logical LOW state to transition the memory device 100 to the deselect state 218. On the next rising clock edge (e.g., at time 296), the signal ADD may present the address B for a burst read sequence. The read DATA (e.g., QB) may be presented at the interface DQ starting during the next clock cycle (e.g., starting at times 298) and held through the subsequent rising clock (e.g., at time 300). The signal SCE may be deasserted in the logical HIGH state during the rising clock edge at the time 300. Here, the memory device 100 is generally transitioned to the deselect state 218 thus ending the burst read sequence after only one data item has been presented.

Power consumed by the memory device 100 is generally dependent upon a clock frequency of the signal CLK and a condition of the memory device 100. While the memory device 100 is in a normal operating condition, the power consumed may by clock frequency dependent. The memory device 100 in the operating condition may consume approximately 20 miliamps (mA) of current at a clock frequency of approximately 33 MHz. The power consumption of the memory device 100 may increase to approximately 25 mA at a clock frequency of approximately 50 MHz. The power consumption may increase into a range of approximately 35 to 50 mA for other operating conditions. The memory device 100 in a standby condition may consume approximately 20 microamps ($\mu$A) at the clock frequency of approximately 33 MHz and approximately 25 $\mu$A at the clock frequency of approximately 50 MHz. Other power consumption levels may be obtainable at other clock frequencies and operating conditions using a variety of semiconductor technologies and design techniques.

The various signals of the present invention are generally "on" (e.g., a digital HIGH, or 1) or "off" (e.g., a digital LOW, or 0). However, the particular polarities of the on (e.g., asserted) and off (e.g., deasserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A device, comprising:
    a memory array; and
    a circuit configured to (i) conduct a single write operation to said memory array in response to an enable signal being asserted and while a control signal is being deasserted, (ii) continue said single write operation as a burst write operation while said enable signal is deasserted and said control signal is asserted said (iii) end said burst write operation in response to said enable signal being deasserted and said control signal deasserted.

2. The device according to claim 1, wherein said circuit comprises:

a counter configured to generate a first plurality of bits in an address sequence used to access said memory array during said burst write operation.

3. The device according to claim 2, wherein said circuit further comprises:

a logic circuit configured to generate a first second plurality of bits in said address sequence.

4. The device according to claim 1, further comprising:

an input register configured to hold write data before transferring said write data to said memory array.

5. The device according to claim 4, further comprising:

an output register configured to hold read data from said memory array before transferring said read data to an external interface.

6. The device according to claim 5, further comprising:

an output amplifier configured to buffer said read data from said output register to said external interface in response to an output enable signal; and an input amplifier configured to buffer said write data from said external interface to said input register.

7. The device of claim 1, wherein said circuit is further configured to:

conduct a single read operation in response to said enable signal being asserted and a write signal being deasserted during said single write operation.

8. The device of claim 1, wherein said circuit is further configured to:

conduct a single read operation in response to said enable signal being asserted and a write signal being deasserted during said burst write operation.

9. The device of claim 1, wherein said circuit is further configured to:

conduct a single read operation in response to said enable signal being asserted and a write signal being deasserted, wherein conducting said single write operation is in further response to said write signal being asserted.

10. The device of claim 9, wherein said circuit is further configured to:

continue said single road operation as a burst read operation while said enable signal is deasserted and said control signal is asserted.

11. The device of claim 10, wherein said circuit is further configured to:

continue said burst read operation as said single read operation in response to said enable signal being asserted and a write signal being deasserted.

12. A method for reading and writing, comprising the steps of:

(A) conducting a single write operation to a memory array in response to an enable signal being asserted and while a control signal is being deasserted;

(B) continuing said single write operation as a burst write operation while said enable signal is deasserted and said control signal is asserted; and (C) ending said burst write operation in response to said enable signal being deasserted and said control signal being deasserted.

13. The method of claim 12, further comprising the step of:

conducting a single read operation in response to said enable signal being asserted and a write signal being deasserted during said single write operation.

14. The method of claim 12, further comprising the step of:

conducting a single read operation in response to said enable signal being asserted and a write signal being deasserted during said burst write operation.

15. The method of claim 12, further comprising the step of:

conducting a single read operation in response to said enable signal being asserted and a write signal being deasserted, wherein conducting said single write operation is in further response to said write signal being asserted.

16. The method of claim 15, further comprising the step of:

continuing said single read operation as a burst read operation while said enable signal is deasserted and said control signal is asserted.

17. The method of claim 16, further comprising the step of:

continuing said burst read operation as said single read operation in response to said enable signal being asserted and said write signal being deasserted.

18. The method of claim 12, further comprising the step of:

ending said single write operation in response to said enable signal being deasserted and said control signal being deasserted.

19. The method of claim 12, further comprising the step of:

continuing said burst write operation as said single write operation in response to said enable signal being asserted and a write signal being asserted.

20. A device comprising:

means for conducting a write operation to a memory array in response to an enable signal being asserted and while a control signal is being deasserted;

means for continuing said single write operation as a burst write operation while said enable signal is deasserted and said control signal is asserted; and means for ending said burst write operation in response to said enable signal being deasserted and said control signal being deasserted.

* * * * *